United States Patent
Gonchar

(10) Patent No.: US 10,247,862 B2
(45) Date of Patent: Apr. 2, 2019

(54) MIRROR, MORE PARTICULARLY FOR A MICROLITHOGRAPHIC PROJECTION EXPOSURE APPARATUS

(71) Applicant: Carl Zeiss SMT GmbH, Oberkochen (DE)

(72) Inventor: Anastasia Gonchar, Fellbach (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 0 days.

(21) Appl. No.: 15/789,125

(22) Filed: Oct. 20, 2017

(65) Prior Publication Data

US 2018/0039001 A1    Feb. 8, 2018

Related U.S. Application Data

(63) Continuation of application No. PCT/EP2016/056617, filed on Mar. 24, 2016.

(30) Foreign Application Priority Data

Apr. 20, 2015    (DE) .................. 10 2015 207 140

(51) Int. Cl.
*G02B 5/08*    (2006.01)
*G03F 7/20*    (2006.01)
(Continued)

(52) U.S. Cl.
CPC ............. *G02B 5/0891* (2013.01); *G02B 1/14* (2015.01); *G02B 5/0816* (2013.01);
(Continued)

(58) Field of Classification Search
CPC .... G02B 1/14; G02B 27/0006; G02B 5/0816; G02B 5/0891; G03F 1/24; G03F 7/70316;
(Continued)

(56) References Cited

U.S. PATENT DOCUMENTS 8,742,381 B2    6/2014  Banine et al.
8,764,905 B1    7/2014  Zimmerman et al.
(Continued)

FOREIGN PATENT DOCUMENTS

DE    102006042987 A1    4/2008
EP       1557722 A1    7/2005
(Continued)

OTHER PUBLICATIONS

Office Action in corresponding German Application 102015207140.5, dated Oct. 20, 2015, along with English Translation.
(Continued)

*Primary Examiner* — Michelle M Iacoletti
(74) *Attorney, Agent, or Firm* — Edell, Shapiro & Finnan, LLC

(57) ABSTRACT

A mirror, in particular for a microlithographic projection exposure apparatus, has a mirror substrate (101), a reflection layer system (102) configured to reflect electromagnetic radiation that is incident on the optically effective surface (100a), and a capping layer (104), which is arranged on the side of the reflection layer system (102) facing the optically effective surface. The capping layer is produced from a first material. Particles (105) of a second material, either individually or in clusters, are applied onto this capping layer, wherein the second material differs from the first material.

17 Claims, 5 Drawing Sheets

(51) Int. Cl.
*G02B 1/14* (2015.01)
*G02B 27/00* (2006.01)
*G03F 1/24* (2012.01)
*G21K 1/06* (2006.01)

(52) U.S. Cl.
CPC ........... *G02B 27/0006* (2013.01); *G03F 1/24* (2013.01); *G03F 7/70316* (2013.01); *G03F 7/70916* (2013.01); *G03F 7/70958* (2013.01); *G21K 1/062* (2013.01); *G21K 2201/067* (2013.01)

(58) Field of Classification Search
CPC .. G03F 7/70916; G03F 7/70958; G21K 1/062
See application file for complete search history.

(56) References Cited

U.S. PATENT DOCUMENTS

| | | |
|---|---|---|
| 2003/0006416 A1 | 4/2003 | Malinowski |
| 2003/0064161 A1 | 4/2003 | Malinowski |
| 2005/0122491 A1 | 6/2005 | Bakker et al. |
| 2007/0028359 A1 | 2/2007 | Robinson et al. |
| 2007/0146660 A1* | 6/2007 | Lorenz Van Der Velden ............ G03F 7/70916 355/30 |
| 2007/0259275 A1 | 11/2007 | Van Herpen et al. |
| 2007/0283591 A1 | 12/2007 | Singer et al. |
| 2008/0143981 A1 | 6/2008 | Ehm et al. |

FOREIGN PATENT DOCUMENTS

| | | |
|---|---|---|
| EP | 1643310 A1 | 4/2006 |
| JP | 2004037295 A | 2/2004 |
| WO | 02054115 A2 | 7/2002 |

OTHER PUBLICATIONS

International Preliminary Report on Patentability and Written Opinion in counterpart International Application No. PCT/EP2016//056617, dated Nov. 2, 2017, 7 pages.

S. Dahl et al.; "Dissociative adsorption of N2 on Ru(0001): A surface reaction totally dominated by steps"; Journal of Catalysis 192, pp. 381-390 (2000).

D. Wayne Goodman; "Model Catalytic Studies over Metal Single Crystals"; Acc. Chem. Res. 1984, 17, pp. 194-200.

International Search Report and Written Opinion in counterpart International Application No. PCT/EP2016/056617, dated Aug. 4, 2016, 11 pages.

* cited by examiner

MIRROR, MORE PARTICULARLY FOR A MICROLITHOGRAPHIC PROJECTION EXPOSURE APPARATUS

CROSS REFERENCE TO RELATED APPLICATIONS

The present application is a Continuation of International Application No. PCT/EP2016/056617, filed Mar. 24, 2016, which claims the priority under 35 U.S.C. § 119(a) to German Patent Application DE 10 2015 207 140.5, filed on Apr. 20, 2015. The disclosures of both related applications are considered part of and are incorporated by reference into the disclosure of the present application in their respective entireties.

FIELD OF THE INVENTION

The invention relates to a mirror, in particular for a microlithographic projection exposure apparatus.

BACKGROUND

Microlithography is used for producing microstructured components, such as for example integrated circuits or LCDs. The microlithography process is carried out in a so-called projection exposure apparatus having an illumination device and a projection lens. The image of a mask (reticle) illuminated by the illumination device is in this case projected by the projection lens onto a substrate (for example a silicon wafer) coated with a light-sensitive layer (photoresist) and arranged in the image plane of the projection lens, in order to transfer the mask structure to the light-sensitive coating of the substrate.

In projection lenses designed for the extreme ultraviolet (EUV) wavelength range, i.e. at wavelengths of e.g. approximately 13 nm or approximately 7 nm, owing to the lack of availability of suitable light-transmissive refractive materials, mirrors are used as optical components for the imaging process. Such EUV mirrors have a mirror substrate and a reflection layer system for reflecting the electromagnetic radiation impinging on the optically effective surface.

In order to avoid damage to the chemically reactive layer materials of the reflection layer system by way of EUV radiation incident during operation, it is known, inter alia, to apply a capping layer onto the reflection layer system, which capping layer can be produced from e.g. a metallic material or an oxide or nitride and which can contribute, inter alia, to suppressing a diffusion of e.g. oxygen ($O_2$) from the adjacent gaseous phase into the reflection layer system.

A problem occurring in practice, in particular during transport, storage or operation, is that such capping layers are also susceptible to molecular contamination (e.g. by hydrocarbons), wherein corresponding contamination depositions on the respective mirror may lead to an impairment of the reflection properties thereof and hence to a reduction in the performance of the projection exposure apparatus overall.

In respect of related background art, reference is made by way of example to US 2003/0064161 A1, WO 02/054115 A2, US 2007/0283591 A1, U.S. Pat. No. 8,764,905 B1 and U.S. Pat. No. 8,742,381 B2.

SUMMARY

It is an object of the present invention to provide a mirror, in particular for a microlithographic projection exposure apparatus, in which undesired contamination is avoided particularly effectively.

A mirror according to one formulation of the invention has an optically effective surface and:
a mirror substrate;
a reflection layer system for reflecting electromagnetic radiation that is incident on the optically effective surface; and
a capping layer, which is arranged on the side of the reflection layer system facing the optically effective surface and which is produced from a first material;
wherein, either individually or in clusters, particles of a second material are applied onto this capping layer, wherein the second material differs from the first material.

The reflection layer system can be a multiple layer system in the form of an alternating sequence of numerous individual layers or else an individual layer (wherein the mirror may have additional functional layers such as barrier layers, etc. in each case).

In some embodiments, the mirror can be a mirror described as under grazing incidence (wherein the reflection layer system can have e.g. an individual layer made of ruthenium (Ru) with a purely exemplary typical layer thickness in the region of 30 nm). Such mirrors operated under grazing incidence are understood here and in the following to mean mirrors for which the reflection angles, which occur during the reflection of the EUV radiation and relate to the respective surface normal, are at least 65°. Sometimes, such mirrors are also referred to in an abbreviated fashion as GI mirrors ("grazing incidence").

Moreover, the mirror can also be a mirror operated under normal incidence (also referred to as an NI mirror, "normal incidence") (wherein the reflection layer system can have e.g. an alternating succession of molybdenum and silicon layers).

In particular, the invention is based on the concept of obtaining a reduction or elimination of contamination by virtue of a few particles of a further material (differing from the material of the capping layer) being applied onto the uppermost surface of the mirror in the direction of the EUV radiation incident during operation or onto a capping layer of the mirror.

Here, the invention proceeds from the discovery, based on experience in the field of catalytic reactions, that adsorption and dissociation processes causing the contamination depositions, which are to be avoided or reduced according to the invention, typically occur predominantly in the region of surface defects (which, as it were, can be considered to be reaction centres for the contamination deposition).

Proceeding from this consideration, the invention follows the approach of effectively blocking precisely these surface defects or "reaction centres", with the consequence that the adsorption and/or dissociation processes and the contamination depositions accompanying these can no longer take place at the relevant positions.

As a result of the fact that, according to the invention, the application of the particles mentioned above only takes place individually (in particular in the form of individual atoms) or in the form of clusters (e.g. in groups of no more than 25 atoms), the invention differs, in particular, from conventional approaches with an uppermost closed layer (on which there would in turn be a significant contamination deposition due to the surface defects which cannot be avoided as a matter of principle).

As a result, an additional application according to the invention of a few particles of a further material brings about a lower reactivity and hence an increased contamination resistance of the uppermost capping layer.

In accordance with one embodiment, the particles of the second material are applied in such a way that the particles preferably colonize defects in the surface structure of the capping layer.

In accordance with one embodiment, the particles are applied in such a way that, compared to an analogous design without the particles, a contamination of the capping layer is reduced during operation or during transport of the mirror.

In accordance with one embodiment, the first material is selected from the group containing metals (e.g. Ru, Mo or Zr), oxides (e.g. $Nb_2O_5$, $ZrO_2$, $TiO_2$), carbides (e.g. SiC), borides (e.g. ZrB, TiB), nitrides (e.g. SiN, ZrN) and mixtures thereof.

In accordance with one embodiment, the first material is ruthenium (Ru).

In accordance with one embodiment, the second material is selected from the group containing noble metals, in particular gold (Au), silver (Ag), palladium (Pd) and platinum (Pt), and sulphur (S).

In accordance with one embodiment, the capping layer has a thickness in the range from 0.5 nm to 10 nm.

In accordance with one embodiment, the number of particles is at most 50%, in particular at most 30%, more particularly at most 10% of the number corresponding to a monolayer of the second material. By contrast, if the number of particles of the second material corresponds to that of a monolayer, the embodiment of a closed layer—precisely explicitly unwanted according to the invention—made of the particles would be possible.

In accordance with one embodiment, clusters of the second material comprise no more than 25 atoms, in particular no more than 20 atoms, more particularly no more than 15 atoms.

The mirror can be designed in particular for an operating wavelength of less than 30 nm, in particular less than 15 nm. However, the invention is not in principle restricted thereto either and, in further embodiments, can also be realized in a mirror designed for operating wavelengths in the VUV range (e.g. less than 200 nm).

The invention furthermore relates to an optical system of a microlithographic projection exposure apparatus, in particular an illumination device or a projection lens, wherein the optical system comprises at least one mirror having the features described above.

Further configurations of the invention can be gathered from the description and the dependent claims.

The invention is explained in greater detail below on the basis of exemplary embodiments illustrated in the accompanying figures.

DETAILED DESCRIPTION

Figure 1:
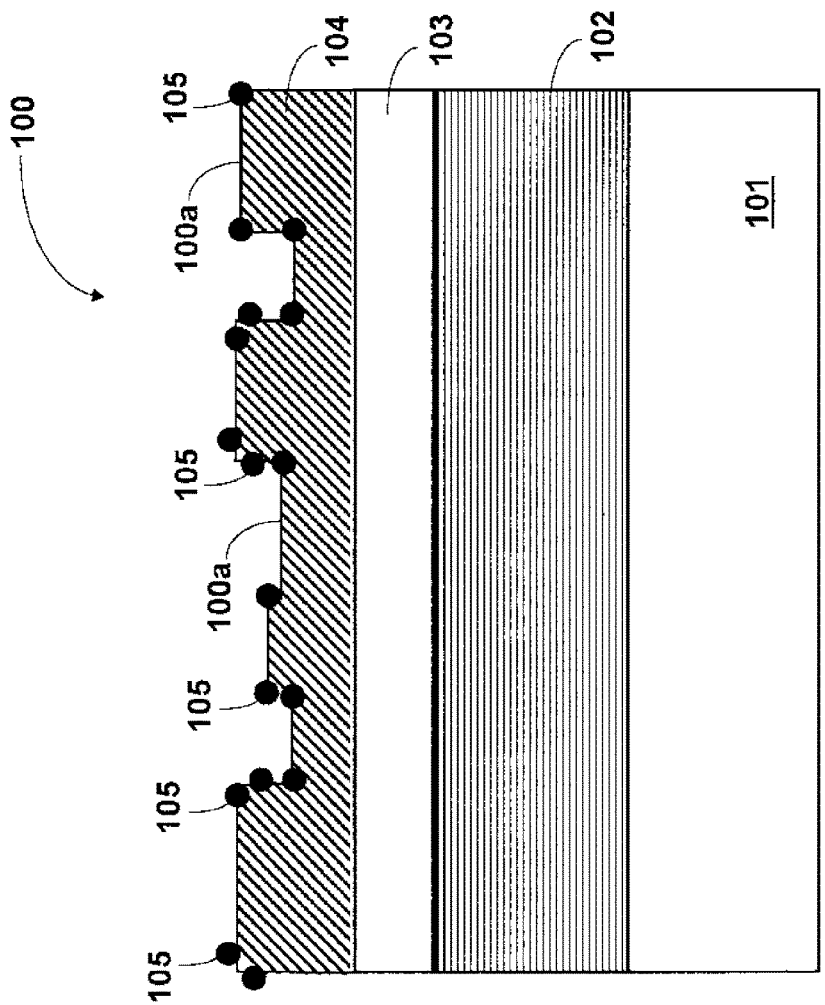
FIG. 1 shows a schematic illustration for elucidating the construction of a mirror according to an exemplary embodiment of the invention.

FIG. 1 shows a schematic illustration for elucidating the construction of a mirror 100 according to the invention in one embodiment of the invention. The mirror 100 can be in particular an EUV mirror of an optical system, in particular of the projection lens or of the illumination device of a microlithographic projection exposure apparatus (described in more detail below in conjunction with FIG. 5).

Reference is made to the fact that, in particular, the layers relevant in conjunction with the explanation of the present invention are depicted in the layer construction of the mirror 100 depicted in FIG. 1 and that the mirror 100 can also have one or more additional layer(s) for providing different functionalities (e.g. adhesive layers, etc.) in embodiments of the invention.

According to FIG. 1, the mirror 100 initially comprises a mirror substrate 101. A suitable mirror substrate material is e.g. titanium dioxide ($TiO_2$)-doped quartz glass, wherein the materials sold under the trademarks ULE® or Zerodur® are known merely by way of example (and without the invention being restricted thereto). In further embodiments, it is also possible to use metallic mirror substrate materials.

Furthermore, the mirror 100 comprises, in a manner known per se in principle, a reflection layer system 102, which, in the embodiment illustrated, merely by way of example, comprises a molybdenum-silicon (Mo—Si) layer stack (and, if appropriate, diffusion barrier layers, etc.). Without the invention being restricted to specific configurations of this reflection layer system 102, one suitable construction that is merely by way of example can comprise, for instance, 50 plies or layer packets of a layer system comprising molybdenum (Mo) layers having a layer thickness of in each case 2.8 nm and silicon (Si) layers having a layer thickness of in each case 4.2 nm.

In further embodiments, the reflection layer system can also be an individual layer (e.g. made of ruthenium (Ru) with a thickness of e.g. 30 nm).

Arranged on the reflection layer system 102 is, in accordance with FIG. 1, an (optional) diffusion barrier layer 103 (e.g. made of silicon nitride ($Si_3N_4$) or boron carbide ($B_4C$)) and a capping layer 104 is arranged thereon. In the exemplary embodiment, the capping layer 104 consists of ruthenium (Ru) and it can have a typical thickness in the range from 0.5 nm to 10 nm (without the invention being restricted thereto). The capping layer 104 can be applied in a manner known per se, e.g. by way of magnetron sputtering, electron beam evaporation or atomic layer deposition (ALD). Moreover, the capping layer 104 can be monocrystalline, polycrystalline or else amorphous (optionally with crystalline inclusions).

According to FIG. 1, particles 105 made of a material differing from the capping layer material, individual gold (Au) atoms in the exemplary embodiment, are applied onto the capping layer 104 in a scattered manner. The particles 105 can be applied in a manner known per se, e.g. by way of magnetron sputtering or electron beam evaporation. Moreover, the particles 105 can be applied at a substrate temperature of more than 100 K, in particular more than 300 K.

As already indicated in FIG. 1, these particles 105 preferably colonize the defects in the surface structure of the capping layer 104 (on corners, edges or vacancies present there in the example).

Below, the principle underlying the present invention is described with reference to the diagrams of FIG. 2-4, which are merely schematic and greatly simplified.

FIG. 4A and FIG. 4B initially serve to elucidate the coming about of a contamination deposition on a conventional mirror (of which only the uppermost capping layer 404 is indicated in FIGS. 4A and 4B).

In the situation depicted in FIG. 4A, contamination molecules 410 (e.g. hydrocarbon molecules) are incident on this capping layer 404 from the surrounding gaseous phase and said contamination molecules are—as indicated in FIG. 4A—adsorbed at defects (edges on the surface of the capping layer 404 in the example). The reason for this adsorption at defects is that adsorption at the terraces, denoted by "T", of the surface structure of the capping layer 404 is not preferred thermodynamically. However—as indicated in FIG. 4B—there is subsequently dissociation of the contamination molecules 410, the dissociation products of which are denoted by 411 and 412 in FIG. 4B and in turn are distributed as contamination deposition over the whole surface of the capping layer 404 of the mirror. The terraces denoted by "T" can have a typical depth dimension in the range from (0.2-2) nm and a lateral extent in the range from (1-10) nm (without the disclosure being restricted thereto). Moreover, the regions at the terraces and between the terraces typically consist of the same material.

Figure 2:
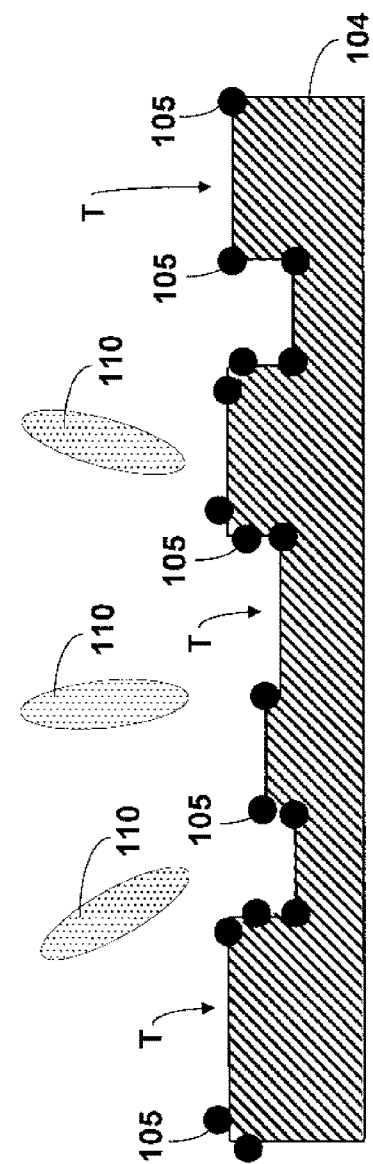
FIGS. 2-3 show schematic illustrations for elucidating the principle underlying the present invention.

FIG. 2 serves to elucidate the principle underlying the invention, in which the scenario described above on the basis of FIGS. 4A and 4B is prevented.

According to FIG. 2, the particles 105 applied individually or in clusters on the capping layer 104 in accordance with the invention likewise preferably colonize the defects in the surface structure of the capping layer 104 (on edges, corners or vacancies present there in the example). As a result, no thermodynamically preferred adsorption space is available any more for contamination molecules 110 incident during transport, storage or operation of the mirror—as likewise indicated in FIG. 2 —, such that the contamination process described above on the basis of FIG. 4B can also no longer take place or only take place to a very small extent.

Figure 3:
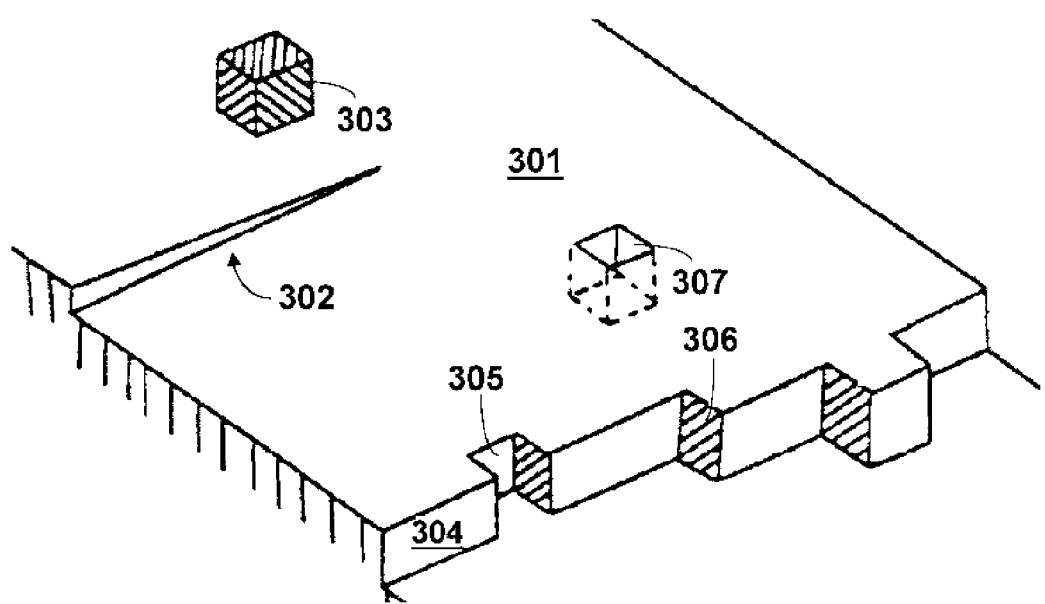
Figure 4:
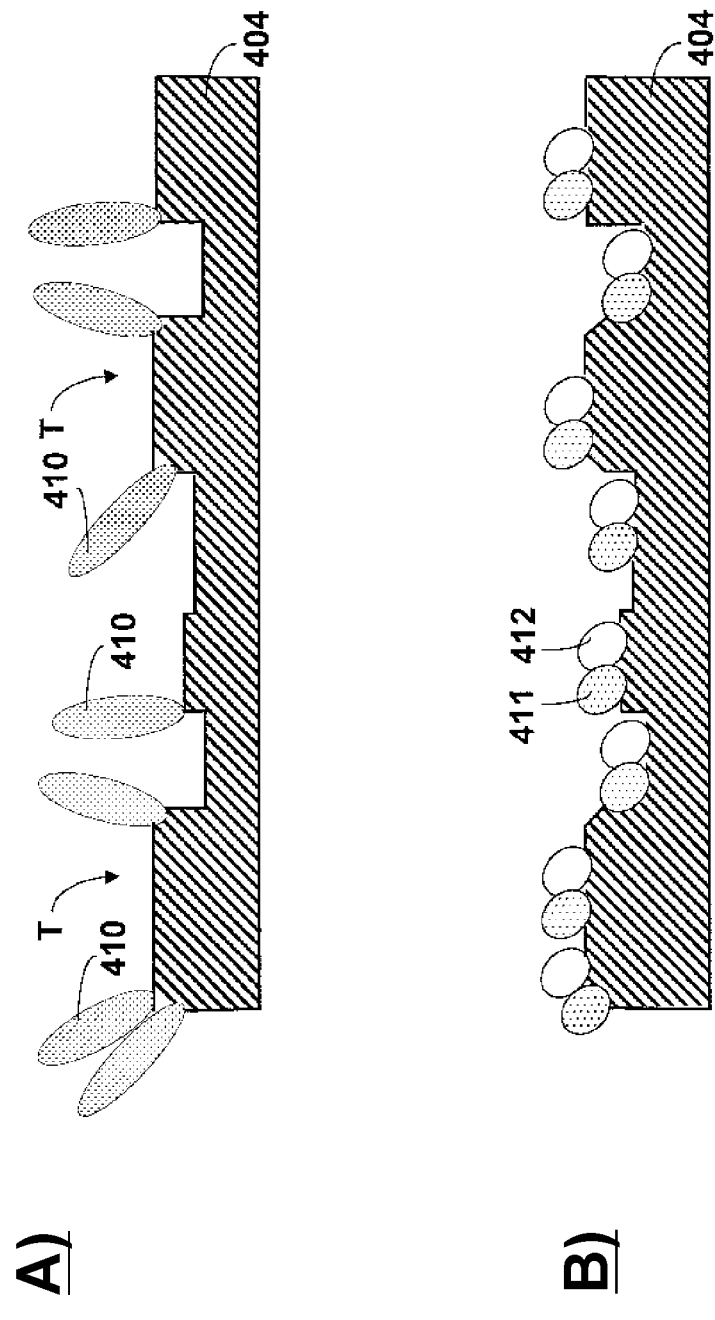
FIGS. 4A and 4B show conventional mirrors with respective contamination depositions.

The defects in the surface structure of the capping layer 104 blocked according to the invention by the particles 105 can be different types of defects (in particular defects with different dimensionality), with only schematic exemplary types of defects being indicated in FIG. 3. According to FIG. 3, a screw dislocation 302, a foreign atom 303, an edge 304, a vacancy 305 situated on an edge, a vacancy 306 situated in a corner and a vacancy 307 situated on a terrace are situated on or at an ideal surface or "terrace" denoted by "301".

Figure 5:
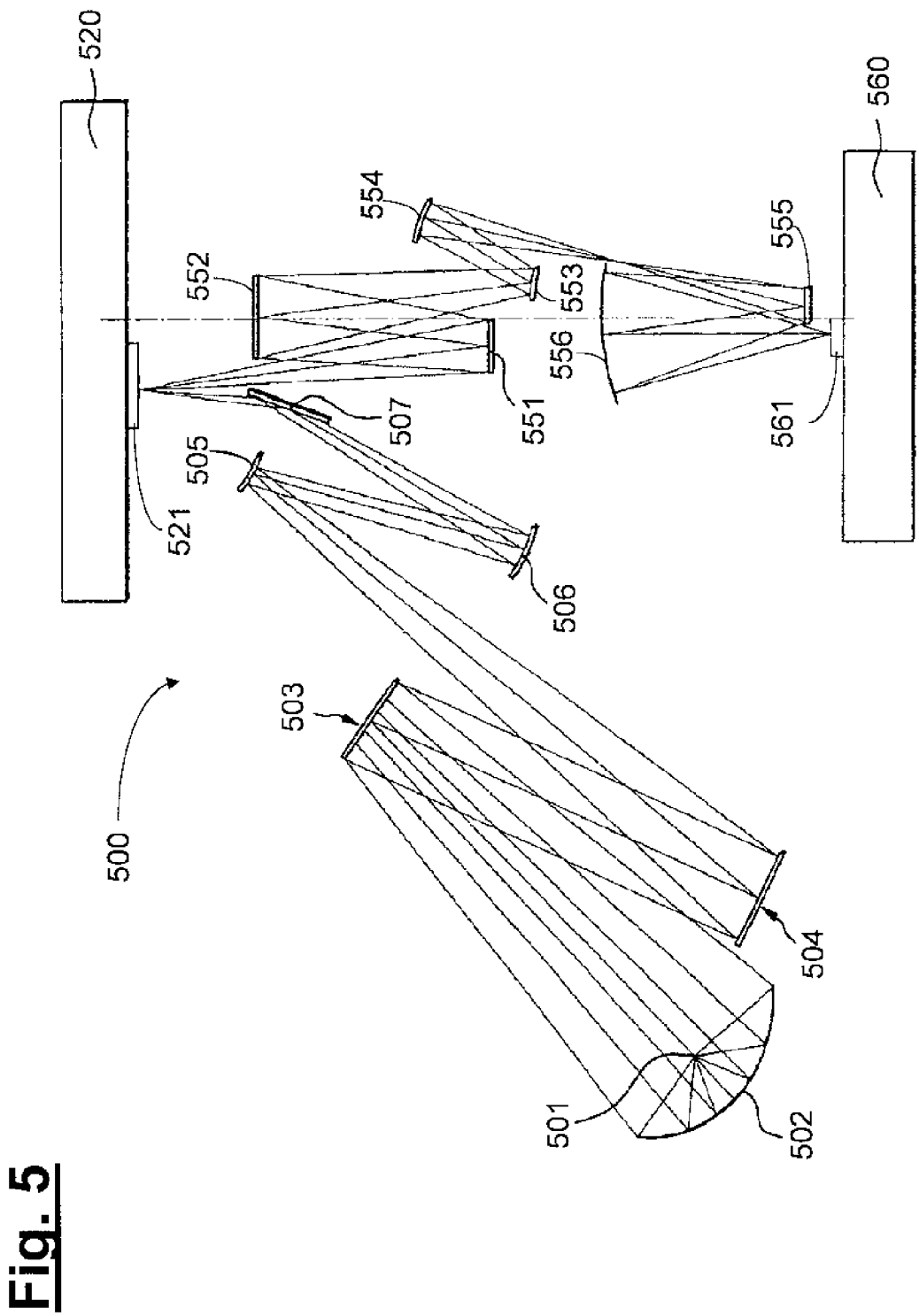
FIG. 5 shows a schematic illustration of an exemplary construction of a microlithographic projection exposure apparatus.

FIG. 5 shows a schematic illustration of one exemplary projection exposure apparatus which is designed for operation in the EUV and in which the present invention can be realized.

In accordance with FIG. 5, an illumination device in a projection exposure apparatus 500 designed for EUV comprises a field facet mirror 503 and a pupil facet mirror 504. The light from a light source unit comprising a plasma light source 501 and a collector mirror 502 is directed onto the field facet mirror 503. A first telescope mirror 505 and a second telescope mirror 506 are arranged in the light path downstream of the pupil facet mirror 504. A deflection mirror 507 is arranged downstream in the light path, said deflection mirror directing the radiation impinging on it onto an object field in the object plane of a projection lens comprising six mirrors 551-556. A reflective structure-bearing mask 521 on a mask stage 520 is arranged at the location of the object field, said mask being imaged into an image plane with the aid of the projection lens, in which image plane is situated a substrate 561 coated with a light-sensitive layer (photoresist) on a wafer stage 560.

The avoidance or reduction according to the invention of the contamination leading to an impairment of the reflection properties can be implemented on any mirror within the illumination device or the projection lens of the projection exposure apparatus 500. Furthermore, the invention is not restricted to the application to a projection exposure apparatus, and so, in principle, other mirrors can also be configured in the manner according to the invention.

Even though the invention has been described on the basis of specific embodiments, numerous variations and alternative embodiments are evident to the person skilled in the art, e.g. through combination and/or exchange of features of individual embodiments. Accordingly, such variations and alternative embodiments are concomitantly encompassed by the present invention, and the scope of the invention is restricted only within the meaning of the appended claims and equivalents thereof.

What is claimed is:

1. Mirror with an optically effective surface, comprising:
a mirror substrate;
a reflection layer system configured to reflect electromagnetic radiation that is incident on the optically effective surface; and
a capping layer, which is arranged on a side of the reflection layer system that faces the optically effective surface and which is produced from a first material;
wherein, either individually or in clusters, particles of a second material are applied onto the capping layer, wherein the second material differs from the first material, and wherein the second material is selected from the group consisting of noble metals and sulphur (S).

2. Mirror according to claim 1, wherein the noble metals comprise at least one of gold (Au), silver (Ag), palladium (Pd) and platinum (Pt).

3. Mirror according to claim 1, wherein the capping layer has a surface structure that comprises defects, and wherein the particles of the second material colonize the defects in the surface structure of the capping layer.

4. Mirror according to claim 1, wherein the particles are applied onto the capping layer such that, when compared to a mirror as claimed in claim 1 but not comprising the particles as recited in claim 1, a contamination of the capping layer during operation of or during transport of the mirror is less.

5. Mirror according to claim 1, wherein the first material is selected from the group consisting of metals, oxides, carbides, borides, nitrides and mixtures thereof.

6. Mirror according to claim 1, wherein the first material is ruthenium (Ru).

7. Mirror according to claim 1, wherein the capping layer has a thickness between 0.5 nm and 10 nm.

8. Mirror according to claim 1, wherein the clusters of the second material comprise no more than 25 atoms.

9. Mirror according to claim 8, wherein the clusters of the second material comprise no more than 15 atoms.

10. Mirror according to claim 1, wherein the reflection layer system is a multiple layer system.

11. Mirror according to claim 1, wherein the mirror has a reflectivity of at least 0.5 for electromagnetic radiation with a predetermined operating wavelength incident on the optically effective surface at an angle of incidence in relation to the respective surface normal of at least 65°.

12. Mirror according to claim 1, wherein the mirror is configured for an operating wavelength of less than 30 nm.

13. Mirror according to claim 1, configured for operation in a microlithographic projection exposure apparatus.

14. Optical system of a microlithographic projection exposure apparatus comprising an illumination device and a projection lens, wherein at least one of the illumination device or the projection lens comprises the mirror according to claim 1.

15. A particle-treated mirror with an optically effective surface, comprising:
- a mirror substrate;
- a reflection layer system configured to reflect electromagnetic radiation that is incident on the optically effective surface; and
- a capping layer, which is arranged on the side of the reflection layer system facing the optically effective surface and which is produced from a first material;
- wherein, either individually or in clusters, particles of a second material are applied onto the capping layer, wherein the second material differs from the first material, and wherein the particles are applied onto the capping layer such that, when compared to a further, untreated mirror configured as the particle-treated mirror but not comprising the applied particles, a contamination of the capping layer during operation of or during transport of the particle-treated mirror is less.

16. The particle-treated mirror according to claim 15, wherein the capping layer has a surface structure that comprises defects, and wherein the particles of the second material colonize the defects in the surface structure of the capping layer.

17. Mirror according to claim 15, wherein the clusters of the second material comprise no more than 25 atoms.

* * * * *

UNITED STATES PATENT AND TRADEMARK OFFICE
CERTIFICATE OF CORRECTION

PATENT NO. : 10,247,862 B2
APPLICATION NO. : 15/789125
DATED : April 2, 2019
INVENTOR(S) : Gonchar Page 1 of 1

It is certified that error appears in the above-identified patent and that said Letters Patent is hereby corrected as shown below:

In the Specification

Column 4, Line 62, delete "FIG." and insert -- FIGS. -- therefor.

Signed and Sealed this
Fourteenth Day of July, 2020

Andrei Iancu
*Director of the United States Patent and Trademark Office*